(12) United States Patent
Park

(10) Patent No.: US 8,723,769 B2
(45) Date of Patent: May 13, 2014

(54) ORGANIC LIGHT-EMITTING DISPLAY DEVICE

(75) Inventor: Sung-Chun Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 666 days.

(21) Appl. No.: 12/504,884

(22) Filed: Jul. 17, 2009

(65) Prior Publication Data

US 2010/0013805 A1 Jan. 21, 2010

(30) Foreign Application Priority Data

Jul. 21, 2008 (KR) ................................. 2008-70607

(51) Int. Cl.
*G09G 3/36* (2006.01)
(52) U.S. Cl.
USPC .................. 345/87; 345/76; 345/80; 345/204; 257/48; 438/14; 438/17; 438/18; 438/149; 349/122; 349/151
(58) Field of Classification Search
USPC .......... 345/80, 204, 76, 87; 349/54, 192, 139, 349/122, 151; 257/59, 72, 48; 438/14, 17, 438/18, 149
See application file for complete search history.

(56) References Cited

U.S. PATENT DOCUMENTS

| 6,590,624 B1 | 7/2003 | Lee |
| 2002/0014837 A1 | 2/2002 | Kim et al. |
| 2004/0021616 A1 | 2/2004 | Goto et al. |
| 2006/0081845 A1* | 4/2006 | Bae .................................. 257/59 |
| 2006/0267885 A1* | 11/2006 | Kwak et al. ..................... 345/76 |
| 2007/0252509 A1* | 11/2007 | Lee ................................ 313/463 |
| 2008/0303755 A1* | 12/2008 | Oh .................................. 345/76 |

FOREIGN PATENT DOCUMENTS

| CN | 1329455 A | 1/2002 |
| CN | 1949069 A | 4/2007 |
| CN | 101114099 | 1/2008 |
| EP | 1 648 033 A2 | 4/2006 |
| EP | 1 850 390 A2 | 10/2007 |

(Continued)

OTHER PUBLICATIONS

Chinese Office Action dated Aug. 4, 2010, issued in corresponding Chinese Patent Application No. 200910152159.4.
Japanese Office action dated Feb. 8, 2011, for corresponding Japanese Patent application 2009-099075.

(Continued)

*Primary Examiner* — Lun Yi Lao
*Assistant Examiner* — Olga Merkoulova
(74) *Attorney, Agent, or Firm* — Christie, Parker & Hale, LLP

(57) ABSTRACT

An organic light-emitting display device including: a substrate including a pixel region and a non-pixel region; a first electrode formed on the pixel region in a first direction; a first wire coupled to the first electrode and formed in the non-pixel region; a second electrode formed in the pixel region in a second direction; a second wire coupled to the second electrode and formed in the non-pixel region; an organic thin film layer formed between the first electrode and the second electrode; a drive circuit coupled to the first wire and the second wire; and a passivation layer formed across the pixel region and the non-pixel region and having an opening to expose at least one of the first wire and the second wire.

13 Claims, 2 Drawing Sheets

(56) References Cited

FOREIGN PATENT DOCUMENTS

| | | |
|---|---|---|
| JP | 07-005481 | 1/1995 |
| JP | 09-026589 | 1/1997 |
| JP | 9-152623 | 6/1997 |
| JP | 2005-346982 | 12/2005 |
| JP | 2007-298939 | 11/2007 |
| JP | 2008-026497 | 2/2008 |
| KR | 10-588018 | 6/2006 |
| KR | 10-717330 | 5/2007 |
| KR | 10-2007-0080425 | 8/2007 |

OTHER PUBLICATIONS

Abstract of Korean Patent Publication No. 2006-127561.
Abstract of Korean Patent Publication No. 2006-29086.
Office action dated Jun. 7, 2011 of Japanese Patent Application No. 2009-099075 which claims priority of the corresponding Korean Priority Application No. 10-2008-0070607., 4 pages.
SIPO Patent Gazette dated Feb. 27, 2013, for corresponding Chinese Patent application 200910152159.4, with English translation of p. 1 only, (3 pages).
European Search Report dated Jun. 8, 2012, for corresponding European Patent application 09251834.9, (7 pages).

* cited by examiner

ORGANIC LIGHT-EMITTING DISPLAY DEVICE

CROSS-REFERENCE TO RELATED APPLICATIONS

This application claims the benefit of Korean Patent Application No. 10-2008-0070607, filed on Jul. 21, 2008, in the Korean Intellectual Property Office, the disclosure of which is incorporated herein, by reference.

BACKGROUND OF THE INVENTION

1. Field of the Invention

Aspects of the present invention relate to an organic light-emitting display device.

2. Description of the Related Art

An organic light-emitting display device is a self-emissive, next-generation, display device that has an improved viewing angle, contrast, response time, and power consumption, as compared to a liquid crystal display device (LCD). An organic light-emitting display device can be a passive-matrix, organic light-emitting display device, where pixels are coupled in a matrix between scan lines and signal lines, or an active-matrix, organic light-emitting display device, where pixels are controlled by thin film transistors (TFT).

The organic light-emitting diodes constituting a pixel are each composed of an anode electrode, an organic thin film layer, and a cathode electrode. When a predetermined voltage is applied between the anode electrode and the cathode electrode, holes injected through the anode electrode are recombined with electrons injected through the cathode electrode, to form excitons in a light-emitting layer. Photons are emitted when the excitons return to a lower energy state.

In general, pixels are tested using a lightening test and an aging test, during the manufacture of an organic light-emitting display device. In this case, a short bar is used to supply a constant test signal to scan lines or signal lines. Korean Patent Publication No. 2006-29086 (Apr. 4, 2006) and Korean Patent Publication No. 2006-127561 (Dec. 13, 2006) disclose a positive short bar and a negative short bar, which are formed in a data pad that is coupled to data lines and a scan pad that is coupled to scan lines. The lightening test is carried out when a test pin is in contact with the short bar. The short bars are removed during a scribing procedure, which involves cutting a substrate when the lightening test is completed.

However, in a structure where a drive circuit is formed on a substrate, or a drive circuit (in the form of semiconductor chips) is mounted onto a substrate using a chip on glass or wire bonding process, pads coupled to input terminals of the drive circuit are formed on an edge of the substrate, adjacent to the scribe lines. Therefore, such an organic light-emitting display device has a problem, in that it is difficult to construct a short bar using the above-mentioned processes.

SUMMARY OF THE INVENTION

An aspect of the present invention provides an organic light-emitting display device, in which a short bar can be easily formed and removed, in order to perform a lightening test and an aging test. The organic light-emitting display device includes a drive circuit that is mounted on a substrate.

Another aspect of the present invention provides an organic light-emitting display device, in which a short bar can be easily formed and removed, in order to perform a lightening test and an aging test. The organic light-emitting display device includes auxiliary electrodes to reduce the resistance of scan lines and data lines.

One exemplary embodiment of the present invention provides an organic light-emitting display device including: a substrate having a pixel region and a non-pixel region; a first electrode formed on the pixel region and extending in a first direction; a first wire coupled to the first electrode and formed in the non-pixel region; a second electrode formed on the pixel region and extending in a second direction; a second wire coupled to the second electrode and formed in the non-pixel region; an organic thin film layer formed between the first electrode and the second electrode; a drive circuit coupled to the first wire and the second wire; and a passivation layer formed on the pixel region and the non-pixel region, and having an opening to expose a portion of at least one of the first wire and the second wire.

Since a substrate should be increased in size, when a drive circuit is mounted onto the substrate, the brightness and performance of the organic light-emitting display device may be degraded, due to increased resistance therein, resulting from increasing the length of wires. Therefore, an auxiliary electrode formed of a low resistance metal is used to mount the drive circuit to the substrate.

Aspects of the present invention provide an organic light-emitting display device, in which a short bar can be easily formed and removed, in order to perform a lightening test and an aging test, and which prevents damage to an auxiliary electrode when the short bar is removed. The organic light-emitting display device includes a drive circuit mounted on a substrate. The auxiliary electrodes reduce the resistance of scan lines and data lines. The organic light-emitting display device may have a high brightness, excellent performance, and a low operating voltage, due to being produced by a simplified manufacturing process that prevents damage to auxiliary electrodes.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION OF THE EXEMPLARY EMBODIMENTS

Figure 1:
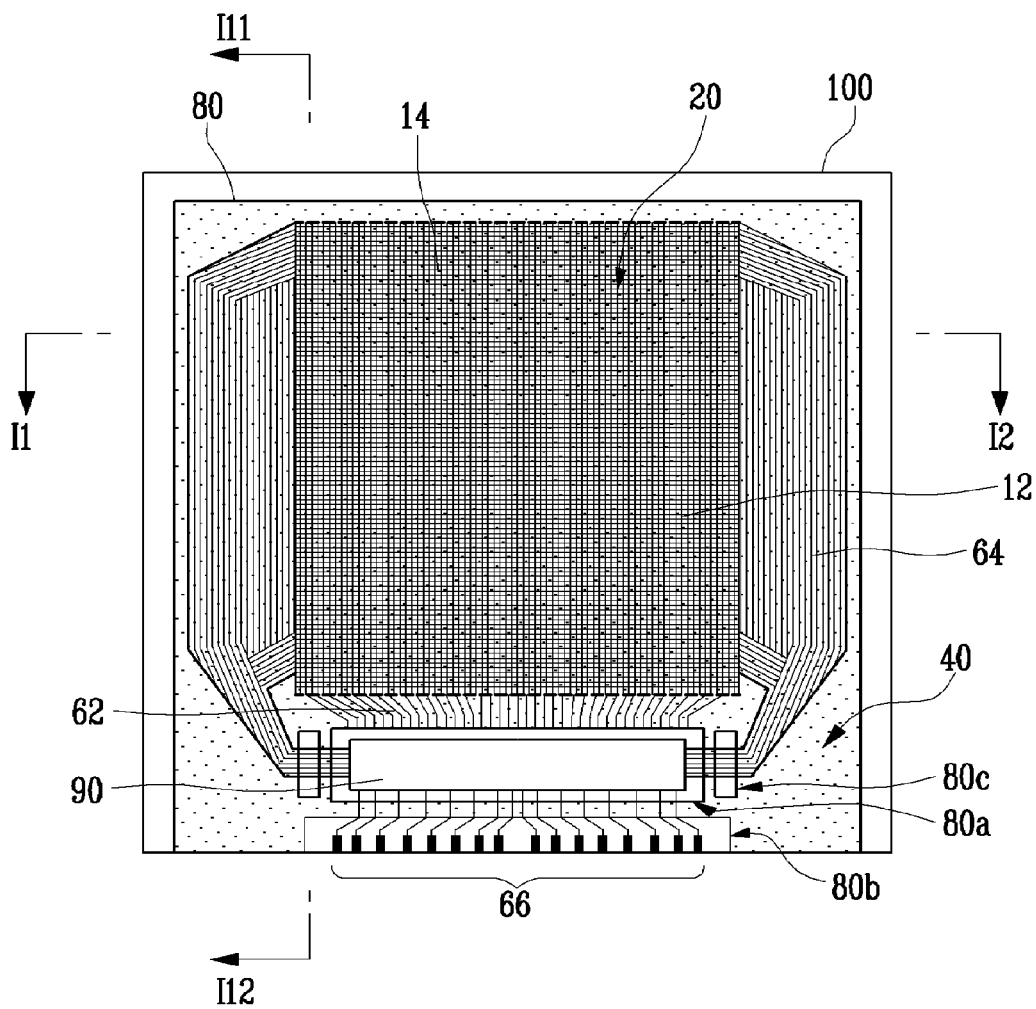
FIG. 1 is a plane view showing an organic light-emitting display device, according to one exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

As those skilled in the art would realize, the exemplary embodiments may be modified in various different ways, without departing from the spirit or scope of the present invention. Accordingly, the drawings and description are illustrative in nature and are not restrictive. In addition, when a first element is referred to as being formed or disposed "on" another element, the first element can directly contact the second element, or one or more intervening elements can be interposed therebetween. Also, when a first element is referred to as being "connected to" a second element, the first element can be directly connected to the second element, or can be connected to the second element with one or more intervening elements.

Figure 2:
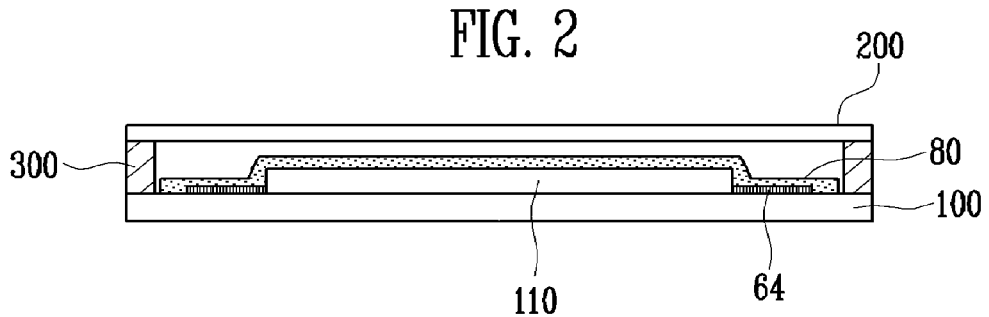
FIG. 2 is a cross-sectional view schematically showing section I1-I2 of FIG. 1.

FIG. 1 and FIG. 2 are a plane view and a cross-sectional view, respectively, showing an organic light-emitting display device, according to one exemplary embodiment of the present invention. FIG. 2 schematically shows section I1-I2 of FIG. 1.

The organic light-emitting display device includes substrate 100, which can be made of an insulating material, such as glass or plastic, or can be made of a metal. The substrate 100 is divided into a pixel region 20 and a non-pixel region 40. The non-pixel region 40 is disposed around the pixel region 20.

An array of organic light-emitting diodes 110 are coupled between a matrix of anode electrodes 12 and cathode electrodes 14, in the pixel region 20 of the substrate 100. Data lines 62 and scan lines 64 are respectively connected to the anode electrodes 12 and cathode electrodes 14, and are disposed in the non-pixel region 40. A power supply line (not shown) supplies a driving voltage to the organic light-emitting diodes 110, and a drive circuit 90 processes external signals supplied through an input pad 66. The power supply line, drive circuit 90, and the input pad 66 are disposed in the non-pixel region 40.

The organic light-emitting diodes 110 each include a portion of one of the anode electrodes 12 and a portion of one of the cathode electrodes 14, which intersect one another, and a portion of an organic thin film layer (not shown) that is disposed therebetween. The organic thin film layer includes a hole transport layer, an organic light-emitting layer, and an electron transport layer, and may further include a hole injection layer and an electron injection layer.

The drive circuit 90 may be formed on the non-pixel region 40 and coupled to data lines 62 and scan lines 64. The drive circuit 90 may alternatively be an integrated circuit semiconductor chip that is mounted on the substrate 100, by a chip on glass or wire bonding process.

A passivation layer 80 covers the pixel region 20 and the non-pixel region 40, and is made of a polyimide-based, a phenol resin-based, or an acrylic resin-based, insulating material. The passivation layer 80 includes openings 80a-80c. The openings 80a and 80b respectively expose an input pad 66 and a region where the drive circuit 90 is mounted. The opening 80c exposes some of the scan lines 64. The opening 80c is a region in which a short bar, to commonly couple the data lines 62 or the scan lines 64, is formed. The short bar is used to perform a lightening test and/or an aging test. The position of the opening 80c may be suitably selected for minimal size. The opening 80c is shown to expose the scan lines 64, but may also be positioned to expose the data lines 62. In addition, the passivation layer 80 may include another opening to expose the data lines 62. The passivation layer 80 may include two openings 80c, each of which exposes about half of the scan lines 64 or data lines 62, for example.

Figure 3A:
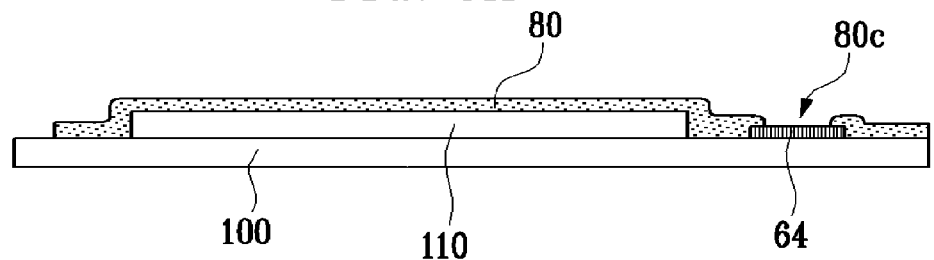
FIG. 3A and FIG. 3B are cross-sectional views schematically showing section I11-I12 of FIG. 1.
Figure 3B:
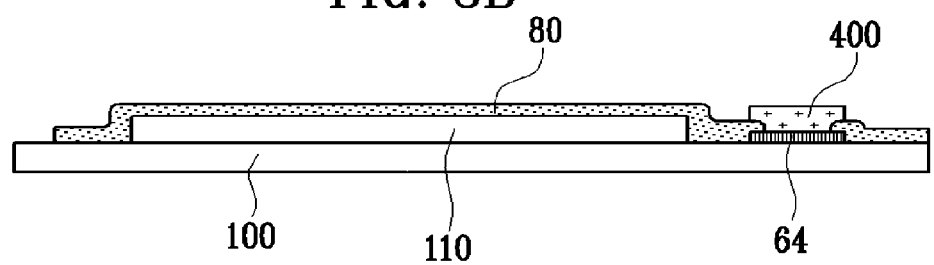

FIG. 3A and FIG. 3B are cross-sectional views showing a cross-section taken along line I11-I12 of FIG. 1. FIG. 3A shows that the opening 80c is formed in the passivation layer 80, and FIG. 3B shows a short bar 400 disposed in the opening 80c and commonly coupled to the scan lines 64.

A test signal is supplied to the organic light-emitting diodes 110, via the data lines 62 or the scan lines 64. A test pin is brought into contact with the short bar 400, so as to perform a lightening test and an aging test.

When the lightening test and the aging test are completed, the short bar 400 is removed. The short bar 400 is generally formed of a metal such as aluminum (Al), which may be removed by an acid solution, or the like. In this case, since the passivation layer 80 covers the entire surface of the substrate 100, the data lines 62 and the scan lines 64 are protected, when the substrate 100 is dipped into the acid solution.

Figure 4:
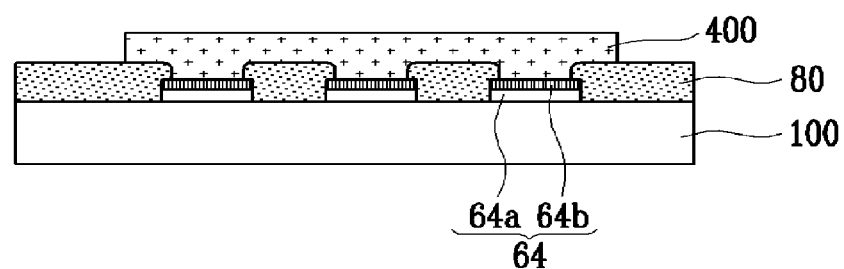
FIG. 4 is a cross-sectional view showing a region of a short bar of an organic light-emitting display device, according to another exemplary embodiment of the present invention.

This exemplary embodiment discloses that the short bar 400 is commonly coupled to some of the scan lines 64, via the opening 80c. However, in other exemplary embodiments the opening 80c can include a plurality of openings formed in the passivation layer 80, to expose each of the scan lines 64. The short bar 400 is commonly coupled to the scan lines 64 through the plurality of openings, as shown in FIG. 4.

The data lines 62 and the scan lines 64 may be made of a transparent electrode material selected from the group consisting of indium tin oxide (ITO), indium zinc oxide (IZO), and indium tin zinc oxide (ITZO). Since the transparent electrode material has a high resistance, the data lines 62 and the scan lines 64 can include a auxiliary electrodes that are formed of a material having a low resistance, so as to reduce the resistance of the data lines 62 and the scan lines 64. For example, the scan lines 64 may include transparent electrodes 64a and auxiliary electrodes 64b, as shown in FIG. 4. The auxiliary electrodes 64b may be made of a metal, such as aluminum (Al), silver (Ag), molybdenum (Mo), copper (Cu) chromium (Cr), or multiple layers thereof. For example, the auxiliary electrode 64b may include multiple layers of molybdenum (Mo), aluminum (Al), and/or molybdenum (Mo).

An encapsulation substrate 200 is disposed on the substrate 100, in order to encapsulate the organic light-emitting diodes 100. The substrate 100 and the encapsulation substrate 200 are attached to each other by a sealant 300, such as an epoxy, frit seal, or the like.

As described above, the organic light-emitting display device, according to one exemplary embodiment of the present invention, includes the passivation layer 80 formed on the substrate 100. The passivation layer 80 includes the opening 80c to expose some of the data lines 62 and/or the scan lines 64. The passivation layer 80 may cover the pixel region 20 and the non-pixel region 40, as shown in FIG. 3A and FIG. 3B. The passivation layer 80 may disposed between the anode electrodes 12 and the cathode electrodes 14.

Figure 5:
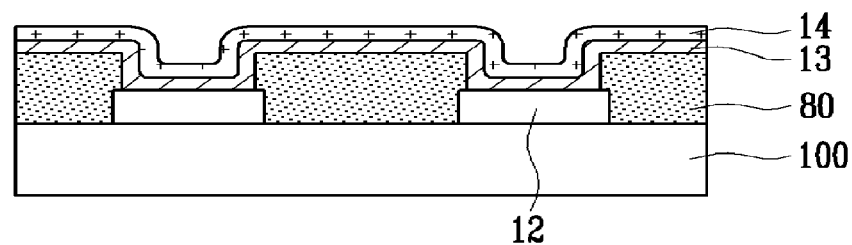
FIG. 5 is a cross-sectional view showing a portion of a pixel region, taken along line I1-I2 of FIG. 1.

FIG. 5 is a cross-sectional view showing a passivation layer 80 disposed between an anode electrode 12 and a cathode electrode 14, according to an exemplary embodiment of the present invention. FIG. 5 cross-sectional view showing a portion of the pixel region 20, taken along line I1-I2 of FIG. 1.

Referring to FIG. 1 and FIG. 5, the anode electrode 12 is formed on the pixel region 20 in one direction, and the data lines 62 extended from the anode electrode 12. The scan lines 64 are coupled to the cathode electrodes 14 and are formed in the non-pixel region 40. In this case, the data lines 62 and the scan lines 64 both comprise auxiliary electrodes and transparent electrodes that are formed on the auxiliary electrodes.

A passivation layer 80 covers the pixel region 20 and the non-pixel region 40, and is patterned to expose the anode electrodes 12. In this case, the openings 80a and 80b expose an input pad 66 and a region where the drive circuit 90 is mounted, respectively. Openings 80c expose the data lines 62. The scan lines 64 are formed on the passivation layer 80.

A barrier rib (not shown) is formed on the passivation layer 80 in the pixel region 20 and extends across the anode electrodes 12. The barrier rib separates the cathode electrodes 12 and an organic thin film layer that is on the passivation layer 80. The walls of the barrier rib are tapered, such that they have a maximum thickness at the passivation layer 80.

After the organic thin film layer 13 is formed on the pixel region 20, the cathode electrodes 14 are formed across the anode electrodes 12. A short bar 400 may be formed during the formation of the cathode electrodes 14.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. An organic light-emitting display device, comprising: a substrate having a pixel region and a non-pixel region; first electrodes disposed in the pixel region and extending in a first direction; first wires coupled to respective ones of the first electrodes and disposed in the non-pixel region; second electrodes disposed in the pixel region, and extending in a second direction; second wires coupled to respective ones of the second electrodes and disposed in the non-pixel region; an organic thin film layer disposed between the first and second electrodes; a drive circuit located in the non-pixel region and coupled to the first and second wires; and a passivation layer formed on the substrate, having an opening to expose a plurality of the first wires to couple a short bar for electrically connecting the plurality of first wires during testing; wherein the first wires extend from the drive circuit to the first electrodes, and wherein the opening is formed above at least a portion of the plurality of the first wires.

2. The organic light-emitting display device according to claim 1, wherein the first wires and the second wires each comprise a transparent electrode and an auxiliary electrode disposed on the transparent electrode.

3. The organic light-emitting display device according to claim 1, wherein the passivation layer comprises a material selected from the group consisting of a polyimide, a phenol resin, and an acrylic resin.

4. The organic light-emitting display device according to claim 1, wherein the passivation layer is disposed between the first electrodes and the second electrodes.

5. The organic light-emitting display device according to claim 1, further comprising an input pad formed in the non-pixel region, coupled to an input terminal of the drive circuit, and exposed through a second opening formed in the passivation layer.

6. The organic light-emitting display device of claim 1, wherein the short bar is disposed in the opening and connected to the first wires.

7. The organic light-emitting display device according to claim 2, wherein:
the transparent electrode comprises a material selected from the group consisting of indium tin oxide (ITO), indium zinc oxide (IZO), and indium tin zinc oxide (ITZO); and
the auxiliary electrode comprises a material selected from the group consisting of aluminum (Al), silver (Ag), molybdenum (Mo), copper (Cu), and chromium (Cr).

8. The organic light-emitting display device according to claim 2, wherein the auxiliary electrode comprises two or more layers that each comprise a metal independently selected from the group consisting of aluminum (Al), silver (Ag), molybdenum (Mo), copper (Cu), and chromium (Cr).

9. An organic light-emitting display device, comprising:
a substrate having a pixel region and a non-pixel region;
first and second electrodes disposed in a matrix in the pixel region;
scan lines disposed in the non-pixel region and coupled to the first electrodes;
data lines disposed in the non-pixel region and coupled to the second electrodes;
an organic thin film layer formed between the first electrodes and the second electrodes;
a drive circuit located in the non-pixel region and coupled to the scan and data lines; and
a passivation layer formed on the substrate, having first and second openings to respectively connect a plurality of the scan lines, or a plurality of the data lines, to a short bar during testing,
wherein the scan lines extend from the drive circuit to the first electrodes,
wherein the data lines extend from the drive circuit to the second electrodes, and
wherein the first and second openings are respectively formed over at least a portion of the plurality of the scan lines and the plurality of the data lines.

10. The organic light-emitting display device of claim 9, wherein the scan and data lines each comprise an auxiliary electrode and a transparent electrode disposed on the auxiliary electrode.

11. The organic light-emitting display device of claim 9, further comprising an input pad disposed in the non-pixel region, coupled to an input terminal of the drive circuit, and exposed through an opening formed in the passivation layer.

12. The organic light-emitting display device of claim 9, wherein:
the passivation layer comprises a material selected from the group consisting of a polyimide, a phenol resin, and an acrylic resin; and
the scan and data lines each comprise an auxiliary electrode and a transparent electrode disposed on the auxiliary electrode.

13. The organic light-emitting display device of claim 9, wherein the passivation layer is disposed between the first and second electrodes and comprises a material selected from the group consisting of a polyimide, a phenol resin, and an acrylic resin.

* * * * *